United States Patent [19]

van Loon et al.

[11] 4,219,835
[45] Aug. 26, 1980

[54] VMOS MESA STRUCTURE AND MANUFACTURING PROCESS

[75] Inventors: Paul G. G. van Loon; Anthony S. Altiery; Steeve T. S. Kay, all of San Jose, Calif.

[73] Assignee: Siliconix, Inc., Santa Clara, Calif.

[21] Appl. No.: 878,685

[22] Filed: Feb. 17, 1978

[51] Int. Cl.² .............................. H01L 29/06
[52] U.S. Cl. ................... 357/55; 357/22; 357/23; 357/53; 357/56
[58] Field of Search .............. 357/22, 23, 55, 53, 357/56

[56] References Cited

U.S. PATENT DOCUMENTS

| | | | |
|---|---|---|---|
| 4,092,660 | 5/1978 | Blocker | 357/55 |
| 4,145,703 | 3/1979 | Blanchard et al. | 357/55 |

Primary Examiner—Edward J. Wojciechowicz
Attorney, Agent, or Firm—Flehr, Hohbach & Test

[57] ABSTRACT

A V-groove metal oxide semiconductor field effect transistor (V-MOSFET) including a body of semiconductor material having three plane regions defining two plane rectifying junctions. A V-groove extends into said body through said two junctions from one surface. The plane region at said surface comprises the source, the intermediate plane region, the channel, and the other region, the drain. A gate electrode is formed over an insulating layer in said groove, a source electrode connects to said source and channel regions and a drain electrode is connected to said drain region. A moat surrounds said transistor and penetrates the source and channel regions and a field electrode is disposed over an insulating layer covering the moat wall.

10 Claims, 14 Drawing Figures

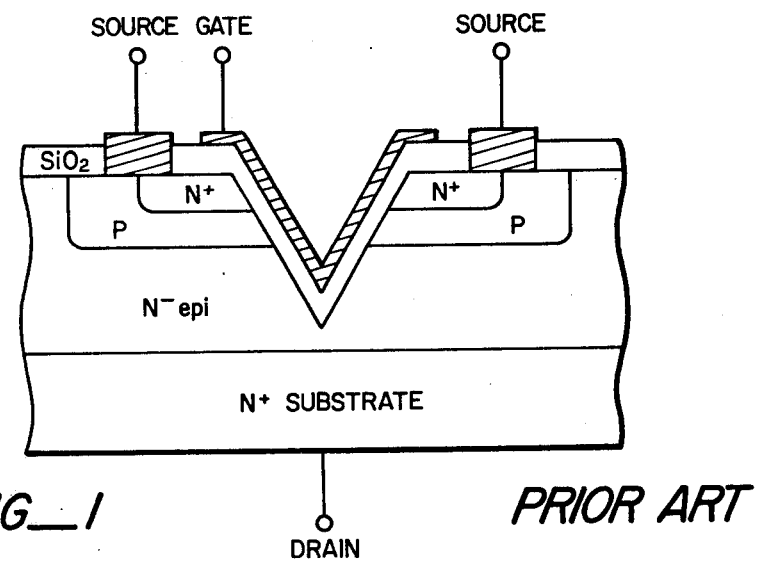
FIG_1  PRIOR ART
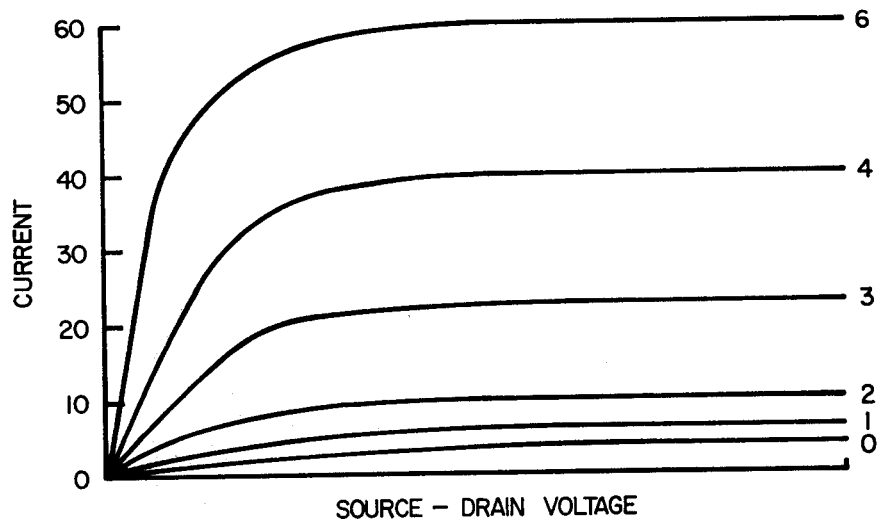
FIG_4
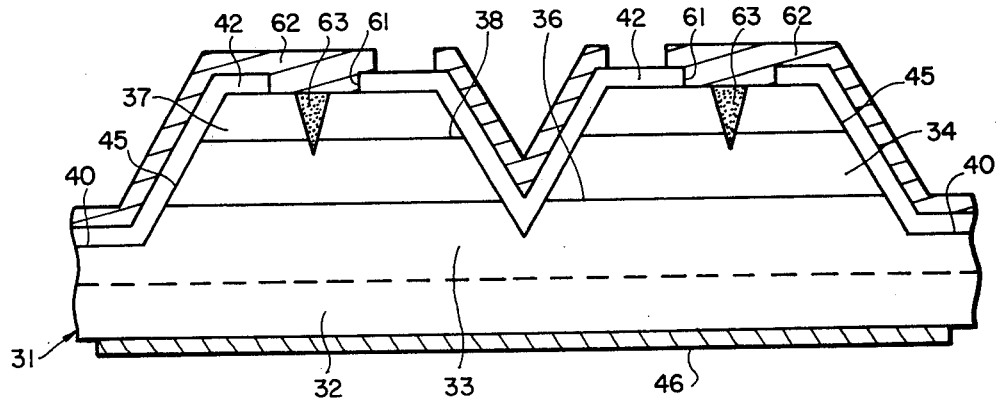
FIG_6

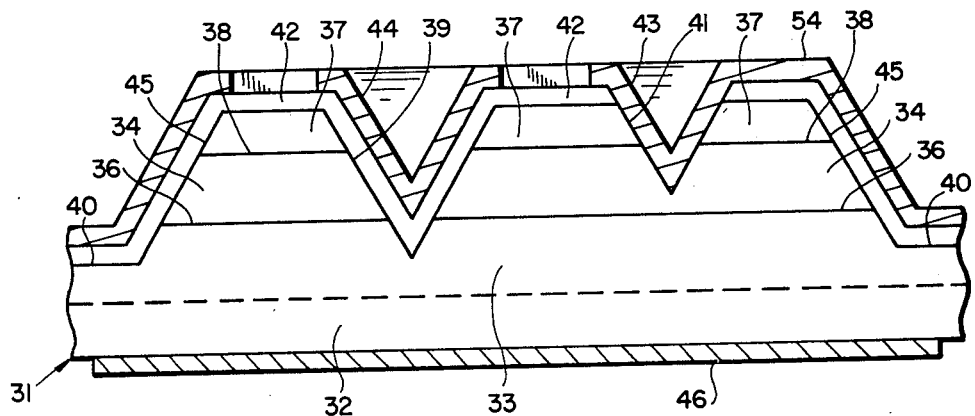
FIG_2
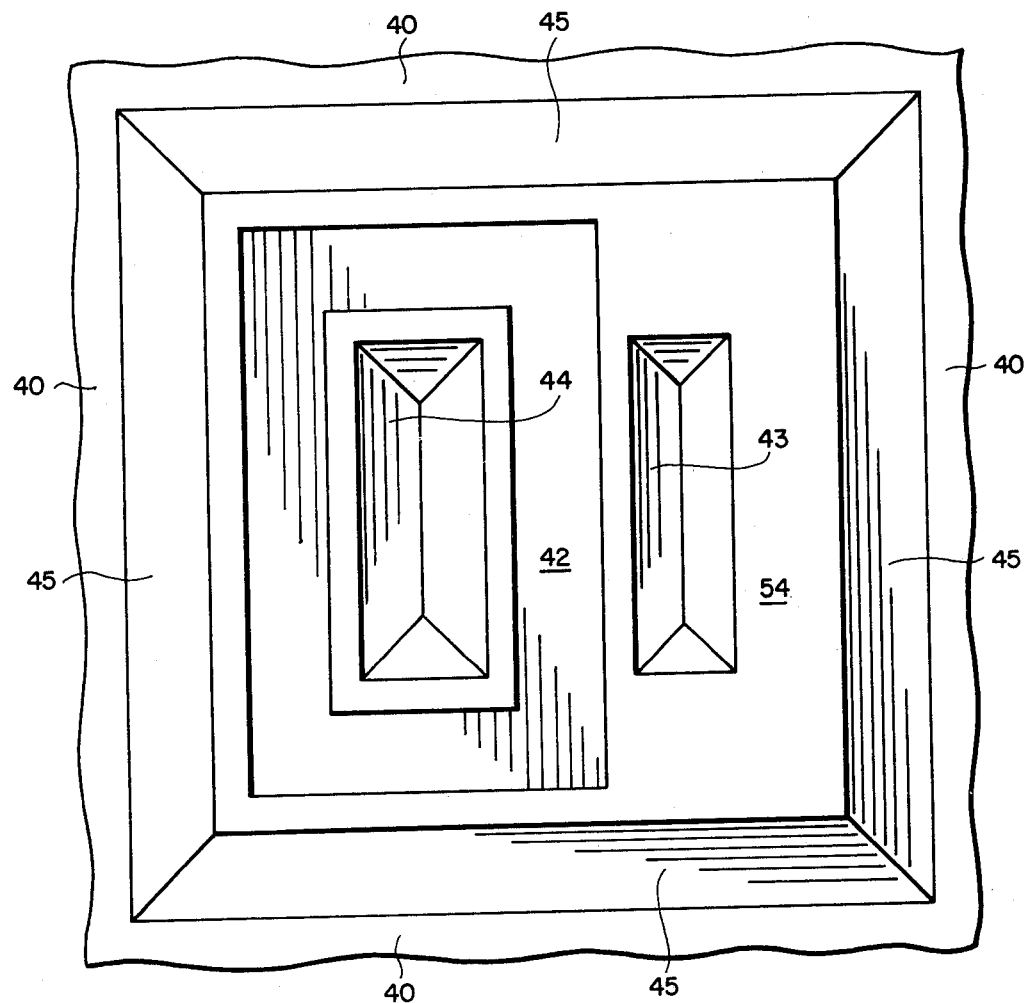
FIG_3

FIG_5A 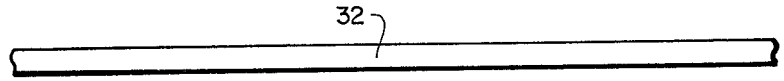
FIG_5B 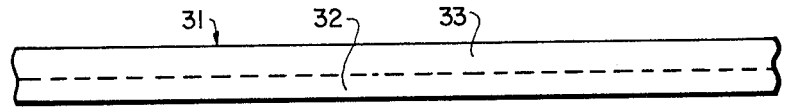
FIG_5C 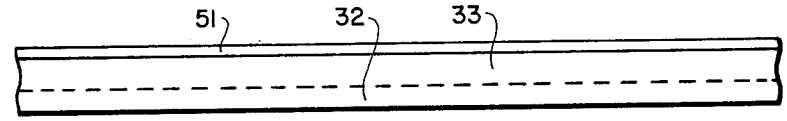
FIG_5D 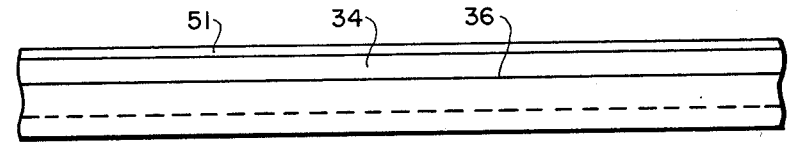
FIG_5E 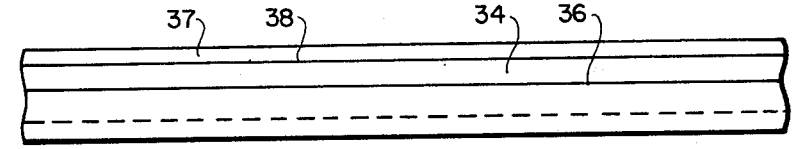
FIG_5F 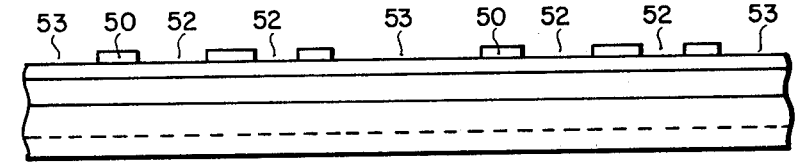
FIG_5G 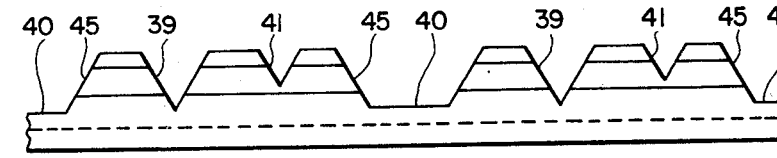
FIG_5H 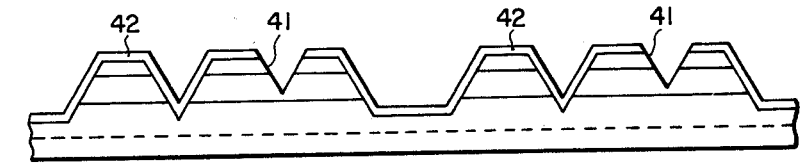
FIG_5I 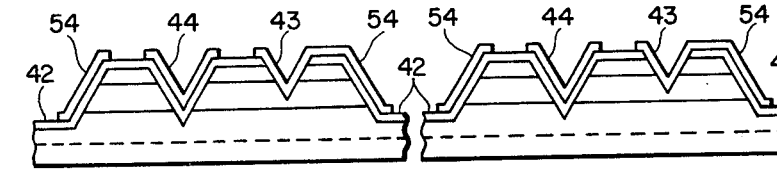

VMOS MESA STRUCTURE AND MANUFACTURING PROCESS

BACKGROUND OF THE INVENTION

This invention relates generally to a metal oxide semiconductor field effect transistor (MOSFET) and more particularly to a V-groove metal oxide semiconductor field effect transistor (V-MOSFET).

MOSFETs of planar construction have been used as integrated circuit elements. That is, the device includes a body of semiconductor material of one conductivity type with spaced inset regions of opposite conductivity type forming source and drain regions with the junctions extending to the surface of the device and defining therebetween a channel region.

One problem with planar devices of the type described is that a large surface area is required for making surface contact to the source and drain regions. Another problem encountered with such circuits has been the control of spacing between the inset regions of opposite conductivity type to achieve small spacing therebetween, that is, short channels.

An improvement has been the V-MOSFET. In this transistor the channel length is controlled by the difference in depth of two insert regions of opposite conductivity type diffused into a body of semiconductor material of a conductivity type opposite to the conductivity type of the first inset region and of the same conductivity type of the second inset region. A V-groove is formed in the body and extends through the two junctions formed by the two insets. An insulating layer is deposited over the surface of the groove and carries the gate electrode. The channel length is controlled entirely by controlling diffusion of the inset regions. In the prior art planar source and drain contacts are made to the inset and body region. Where VMOS transistors are manufactured as part of integrated circuits the semiconductor body is designated as common source electrode and the inset regions of like conductivity as the body are designated individual drain electrodes. A fourth electrode is connected to the inset region of opposite conductivity type as the semiconductor body and is the back gate electrode. In integrated circuits the back gate electrode is used to provide substrate to source bias.

A different category of VMOS transistors is the VMOS power transistor. The structure of the VMOS power device is identical to the devices described above with the exception that the semiconductor body is the drain electrode and the insert is the source electrode. Power transistors do not require a separate bias between back gate and source. It is therefore customary in the present art to provide planar contacts which combine both the source and the back gate electrode. The contacts are thus comprised of exposed regions of opposite conductivity. It is known from literature and experience that the etching rates of oxides grown over regions of opposite conductivity differ. Differences in etch rates add complexity to processing. Any residual oxide left in the contact windows results in either a floating source contact or a floating back gate contact or an electrode with high contact resistance, rendering the device useless for high power applications.

A prior art power V-groove insulated gate field effect transistors is illustrated in FIG. 1. The insert regions, forming the source and the channel have their respective junctions terminating at the surface and at the groove walls. They are manufactured by two photomasking steps. A third masking step is required to delineate and etch the V-groove. A fourth masking step provides for contact windows to the source and channel back gate region. After metallization a fifth masking step delineates the metal electrodes. Final passivation of the device requires a sixth masking step to expose the bonding pads for wire bonding to the device package.

OBJECTS AND SUMMARY OF THE INVENTION

It is a general object of the present invention to provide a V-groove insulated gate field effect transistor having a mesa structure.

It is another object of the present invention to provide a V-groove field effect transistor having a plane junction structure.

It is a further object of the present invention to provide a V-groove field effect transistor having a mesa structure with plane junction extending to the V-groove and mesa surfaces.

It is another object of the present invention to provide a V-groove gate region and V-groove contacts for the source and back gate regions of a field effect transistor including plane junctions and V-groove isolation moats and field electrodes.

It is a further object of the present invention to provide a V-groove gate region and contact to source and back gate region through preferential alloying of aluminum to silicon.

The foregoing and other object of the invention are achieved by structure including a plurality of plane layers of semiconductor material formed as a body of semiconductor material to define at least a pair of plane rectifying junctions, a groove surrounds a device and defines a mesa, a groove extends into said body through said junctions at the mesa, an insulating layer is formed on the surface of the groove and wall of the mesa, a conductive gate electrode is disposed over the insulating layer in the groove, a conductive field electrode extends over the insulating layer on the mesa wall, a source electrode constants the first and second layers to thereby form a source body contact and a drain contact contacts the body.

BRIEF DESCRIPTION OF THE DRAWINGS

FIG. 1 is a sectional view showing a power VMOS representing prior art.

FIG. 2 is a sectional view showing a V-MOSFET in accordance with one embodiment of the present invention.

FIG. 3 is a plane view of the V-MOSFET of FIG. 2.

FIG. 4 shows the current through the device for various gate and source-drain voltages.

FIG. 5A-5I show the steps in forming the device shown in FIGS. 2 and 3.

FIG. 6 is a sectional view of a V-MOSFET in accordance with another embodiment of the invention.

DESCRIPTION OF PREFERRED EMBODIMENTS

Referring to FIGS. 2 and 3, there is shown a device in accordance with the present invention. The device includes a body 31 having regions 32 and 33 of the same conductivity type but different impurity concentration. A layer 34 of opposite conductivity type forms a rectifying junction 36 with the layer 33. A second layer 37 of said one conductivity type forms a second plane junction 38 with the layer 34. As will be presently described, a body having the various plane layers and plane junctions is then masked and anisotropically etched to form a first V-groove 39 which extends and cuts through both of the rectifying junctions 36 and 38 and a second V-groove 41 extends and cuts through the first junction 38. The etching also forms deep side cuts 40 which form a moat surrounding the first and second V-grooves to form a mesa. The side cuts can be employed for dicing of a wafer to form individual devices.

As is well known, the depth of the grooves is controlled by controlling the width of the mask openings. Anisotropic etching has a low rate of attack on the <111> plane and a high rate of attack on the <100> plane of a semiconductor body. Thus, the wafer is selected to present the <100> plane to the surface. Etching stops when an apex is formed since there is no more <100> surface.

The device includes an oxide layer 42 formed in the groove 39 over the surface of the body and on the inclined walls 45 of the mesa. The oxide layer does not cover groove 41. A metal layer is formed on the surface of the device to extend into the grooves 39 and 41 and over the inclined walls 45 of the surrounding mesa. The metal is then masked and etched to form a metal contact 43 which extends into the groove 41 and contacts the regions 34 and 37 to form a source-body electrode and which extends over the oxide 42 on the walls of the mesa to form a field electrode. A metal layer 44 is also defined in the V-groove 39 overlying the oxide 42. The metal layer 44 forms the gate electrode. A metal layer or electrode 46 contacts the body and forms the drain contact. Thus, there if formed a source-body electrode, a gate electrode and a drain electrode.

Operation of devices of this type is well known. A voltage is applied between the source and drain, and a gate voltage is applied to form an inversion layer adjacent the gate electrode in the body 34 to define a channel which permits conduction of current between the upper layer 37 and the body 31.

Referring to FIG. 4, the current voltage characteristics of a typical device are shown. The curves are labeled with the gate voltage, while the coordinates represent the source-drain voltage and current through the device.

Referring to FIGS. 5A–5I, the steps in forming a device such as that shown in FIGS. 2 and 3 are illustrated. It will be understood, however, that the particular processes described are not the only processes which may be used to form the various regions and contacts. Other processes may be employed and still result in a field effect transistor in accordance with the invention: that is, a field effect transistor including plane junctions, a V-groove gate region, and surrounding side walls which include a field electrode and contact to the source-body via a V-groove.

Referring now to the figures, a wafer 32 which may, for example, be N-type semiconductor material having a resistivity of 0.007–0.05 ohm cm., is selected. FIG. 5A. Thereafter, a layer 33 of the same conductivity type is formed on the surface of the wafer 32. The layer 33 is preferably formed by epitaxial growth. The layer 33 may have a thickness of about 5 microns with a resistivity of between 5 and 8 ohm-cm. The two layers together comprise the body 31, FIG. 5B.

Thereafter, a thin oxide layer 51 is formed on the surface of the epitaxial layer 33 by conventional thermal oxidation. The thickness of the oxide layer may be approximately 1000 A. By ion implantation through the oxide layer a p-type region 34 is formed which defines a junction 36 with the layer 33, FIGS. 5C and 5D. The charge concentration of the p-type ions in layer 34 is approximately $10^{13}$ atoms per $cm^2$. The oxide layer is then removed. By conventional N-type diffusion, an N-type layer 37 is formed in the P-type region to form a second planar junction 38. The p-type region itself diffuses further inwardly as the N-type diffusion is carried out, FIG. 5E.

Thereafter, a field oxide layer 50 is formed on the surface and is masked and etched to define a plurality of adjacent openings 52 of different widths and a surrounding ring 53 which defines the mesa. The wafer is then anisotropically etched to create grooves and cleaned to form the structure shown in FIG. 5G. The etching defines the grooves 39 and 41 and the surrounding groove 40 with sides 45 which serves to isolate one device from another and form a mesa for each device. An oxide layer 42 of conventional gate oxide thickness is formed on the surface and the walls of the grooves 39 and 45 as shown in FIG. 5H and masked and etched to expose the V-groove 41. Thereafter, a metal layer is applied to the complete surface, masked and etched to define the various electrodes, namely, the field electrodes 54 over the oxide layer along the side walls of the mesa; the contact 43 which contact the source-body; and the metal contact 44 which forms the gate electrode. The layer may be aluminum or other suitable metal. Preferably, the device is then passivated by forming on the surface of the device a glass passivation layer.

FIG. 6 illustrates a device similar to that of FIGS. 2 and 3. Like reference numbers are applied to like parts. In the device of FIG. 6, rather than forming a V-groove for contacting the source and body, the contact is formed by opening a window 61 in the oxide layer 42, applying metal contact 62 which overlies the sides of the inclined walls 45 and which makes contact to the upper surface of the layer 37. Thereafter, the wafer is heated to alloy the contact metal 62 into the wafer as shown at 63 to make contact with the center or body region 34 as indicated. This alloy treatment may take place before the metal electrodes are delineated by photomasking technique or alternately thereafter.

It is known that excess aluminum will for a sink into which silicon will dissolve until saturation of the aluminum has been reached. Transistor manufacturers have been plagued by this unwanted effect of alloying since deep alloy pits are formed as a consequence and shallow structures, such as emitter-base junctions, are frequently shorted by these pits. Wherever design permits metal electrodes have been proportioned in such a way that the contact window is isolated from large bodies of aluminum by necking down of lead lines. Alloying is done after the metal electrodes and lines are defined by photo masking and etching technique. Other solutions are found in the use of certain ratios of silicon to aluminum during metal evaporation for the purpose of saturating the metal-to-wafer interface prior to alloy.

In the device of FIG. 6 the alloy-pit effect is used purposely by allowing the silicon in the contact window to dissolve into a large body of aluminum. The resulting alloy pits are sufficiently deep to penetrate the surface region and contact the center region thereby providing electrical contact to both. Alloy pit depth is controlled by time and temperature. In other respects, the device is and operates as previously described.

It is apparent that the manufacture of the VMOS mesa device of the present invention is relatively simple. It requires a minimum of manufacturing steps while providing an improved device.

What is claimed is:

1. A V-groove metal oxide semiconductor field effect transistor comprising a body of semiconductor material including a substrate of one conductivity type, a first region of opposite conductivity type forming a first planar rectifying junction with said substrate, a second region of said one conductivity type forming a second planar junction with the first region, a V-groove in said body extending through said first and second junctions, an insulating layer formed on the walls of said groove and a conductive layer formed on said insulating layer at least adjacent the inclined edges of said first region to form a gate electrode, a groove surrounding said V-groove to form a mesa with side walls, said first and second junctions extending to said side walls, an insulating layer disposed on the surface of said device and on the side walls, and a metal layer disposed on said insulating layer to form a field electrode, a source-body electrode extending through said second region and contacting said first and second regions adjacent said groove, and a metal drain electrode contacting said substrate.

2. A field effect transistor as in claim 1 in which said source-body electrode contacting said first and second regions is formed by alloying into said body through said second junction.

3. A field effect transistor as in claim 1 in which said source-body electrode contacting said first and second regions is formed by a V-groove which extends through said second junction and a metal layer formed on the surface of said groove.

4. A field effect transistor including a body having a substrate of one conductivity type, first and second contiguous regions of opposite and the same conductivity type respectively forming a first planar rectifying junction with said substrate and a second rectifying junction with one another, a V-groove extending into said body through said first and second junctions, a metal-oxide gate electrode formed in said groove, a groove surrounding said V-groove to form a mesa with side walls to which said first and second junctions extend, a metal-oxide field electrode formed on said side walls, a source-body electrode extending through said second junction and forming ohmic contact with said first and second regions and a drain electrode contacting said body.

5. A V-groove metal-oxide semiconductor field effect transistor comprising a body of semiconductor material including a substrate of one conductivity type, a first region of opposite conductivity type forming a first planar rectifying junction with said substrate, a second region of said one conductivity type forming a second planar rectifying junction with the first region, a V-groove in said body extending through said first and second junctions, a groove surrounding said V-groove to form a mesa with side walls, an insulating layer formed on the walls of said groove and the surface and the side walls, a conductive layer formed on said insulating layer extending into said groove at least adjacent the inclined edges of said first region, a conductive layer on the side walls of said mesa and connected to means forming ohmic contact to said first and second regions through said second region adjacent said groove, and a metal drain electrode forming ohmic contact to said substrate.

6. A field effect transistor as in claim 1 in which said means forming ohmic contact to said first and second region is formed by alloying into said body through said second junction.

7. A field effect transistor as in claim 1 in which said means forming ohmic contact to said first and second regions is formed by a V-groove which extends through said second junction and a metal layer formed in said groove.

8. The method of forming a V-groove metal oxide field effect transistor comprising the steps of selecting a body of semiconductor material of one conductivity type, said body having first and second major surfaces, forming at one major surface of said body a first region of opposite conductivity type to form a planar junction with the body forming a second region of the same conductivity type to form a second planar junction with the first region forming on said major surface an oxide mask having a window of predetermined width and a second surrounding opening of predetermined width to expose selected portions of said surface, etching said exposed surfaces until a V-groove is formed in said body at said windows to extend through said first and second junctions, and a surrounding groove is formed to define a mesa, removing the oxide mask, forming a gate oxide on the surface of said device to extend into said groove and on the walls of said mesa, providing a metal layer extending into said groove to form a gate electrode and a metal layer on the walls of said mesa to provide a field electrode, forming a source-body electrode which extends into said body from said one surface to form ohmic contact to said first and second layers, and forming a drain contact to the other surface of the body.

9. A method of forming a V-groove metal-oxide field effect transistor as in claim 8 in which said source-body contact is formed by forming a window in said gate oxide and alloying into said body through said window.

10. The method of forming a V-groove metal oxide field effect transistor as in claim 8 in which said source-body contact is formed by forming a second window of predetermined width in said oxide mask whereby during said etching a second V-groove is formed extending through said second region into said first region of said second window and providing a metal layer in said second V-groove to contact the first and second regions.

* * * * *